United States Patent [19]

Endo et al.

[11] Patent Number: 4,532,150

[45] Date of Patent: Jul. 30, 1985

[54] METHOD FOR PROVIDING A COATING LAYER OF SILICON CARBIDE ON THE SURFACE OF A SUBSTRATE

[75] Inventors: Morinobu Endo, Nagano; Minoru Takamizawa, Tokyo; Tatsuhiko Hongu, Kanagawa; Susumu Ueno, Ibaraki, all of Japan

[73] Assignee: Shin-Etsu Chemical Co., Ltd., Tokyo, Japan

[21] Appl. No.: 564,293

[22] Filed: Dec. 22, 1983

[30] Foreign Application Priority Data

Dec. 29, 1982 [JP] Japan .................................. 57-228504

[51] Int. Cl.³ ............................................. C23C 13/04
[52] U.S. Cl. .......................................... 427/39; 427/38
[58] Field of Search ................................... 427/38, 39

[56] References Cited

PUBLICATIONS

Vossen et al, *Thin Film Processes,* Academic Press, New York, N.Y., 1978, pp. 353–354.

*Primary Examiner*—Richard Bueker

[57] ABSTRACT

The invention provides a novel method for providing the surface of various kinds of substrate articles, e.g. sapphire, quartz, alumina, metals, glass, plastics and the like with a coating layer of an amorphous silicon carbide of the formula $Si_xC_{1-x}$, in which x is a positive number of 0.2 to 0.9, by exposing the surface of the substrate article to an atmosphere of plasma generated in a gaseous atmosphere of an organosilicon compound having no halogen or oxygen atom directly bonded to the silicon atom, such as hexamethyl disilane, optionally admixed with a vapor or gas of a hydrocarbon compound, e.g. methane, benzene and the like.

9 Claims, 2 Drawing Figures

METHOD FOR PROVIDING A COATING LAYER OF SILICON CARBIDE ON THE SURFACE OF A SUBSTRATE

BACKGROUND OF THE INVENTION

The present invention relates to a method for providing a coating layer of amorphous silicon carbide having a non-stoichiometric composition to the surface of various kinds of substrates or, in particular, on the surface of various kinds of materials used in the electronics.

It is well known that a coating layer of high-purity silicon carbide is excellent in the heat resistance, oxidation resistance, resistance against various chemicals and heat conductivity. In addition, silicon carbide has a characteristic as a semiconductor so that attempts are being made for providing a coating layer of silicon carbide on to the surface of various kinds of materials used in the technology of electronics such as semiconductor substrates and the like as well as various kinds of tools and vessels used in the semiconductor processing.

The method hitherto developed for providing a coating layer of silicon carbide on to the substrate surface include (1) a method in which silicon carbide is subjected to sublimation at a temperature of 2000° C. or higher into vapor which is deposited and recrystallized on the surface of a substrate in the form of a coating layer (see, for example, Japanese Patent Publication No. 41-9332), (2) a method in which a gaseous mixture of a silane compound such as those expressed by the general formula $(CH_3)_nSiCl_{4-n}$, in which n is zero or a positive integer not exceeding 4, and a hydrocarbon compound such as methane is pyrolyzed at a temperature of 1600° to 2000° C. in contact with the substrate surface to deposit silicon carbide thereon (see, for example, Japanese Patent Publication No. 44-18575), (3) a method in which a gaseous mixture composed of a silane compound having at least one hydrogen atom directly bonded to the silicon atom such as $SiH_4$ and a hydrocarbon compound is pyrolyzed in contact with the substrate surface to deposit the silicon carbide as the pyrolysis product on the surface (see, for example, British Patent No. 1,039,748) and (4) a method in which a mixture of silicon dioxide or elementary silicon and carbon is heated at a high temperature of 1500° C. or higher (see, for example, Japanese Patent Kokai No. 52-42365).

None of these prior art methods is, however, quite satisfactory from the standpoint of practicability. For example, the first method is disadvantageous due to the use of an extremely high temperature of 2000° C. or higher and cannot be applied when the substrate material cannot withstand such a high temperature. The second method is disadvantageous, in addition to the also considerably high temperature of the pyrolysis, due to the difficulty in the handling of the chlorosilane compound which is readily hydrolyzed to produce corrosive hydrogen chloride. The third method has problems that, although a coating layer of crystalline silicon carbide is obtained at a relatively low temperature of pyrolysis, an unbalance is present between the temperatures or velocities of pyrolysis of the silane compound and the hydrocarbon compound necessitating an addition of hydrogen chloride to the gaseous mixture or elaborate controlling means of the temperatures of the reactant gases. The fourth method is also disadvantageous due to the high working temperature of 1500° C. or higher limiting the material of the substrate.

SUMMARY OF THE INVENTION

An object of the present invention is to provide a novel and improved method for providing a coating layer of silicon carbide on to the surface of a substrate.

More particularly, the object of the present invention is to provide a novel method for providing a coating layer of amorphous and non-stoichiometric silicon carbide expressed by the formula $Si_xC_{1-x}$, in which x is a positive number in the range from 0.2 to 0.9, on to the surface of a substrate.

Thus, the method of the present invention for providing a coating layer of amorphous silicon carbide of the formula $Si_xC_{1-x}$, where x is 0.2 to 0.9, on to the surface of a substrate comprises subjecting the surface of the substrate to exposure to an atmosphere of plasma generated in a gaseous atmosphere containing a vapor of an organosilicon compound having no halogen or oxygen atom directly bonded to the silicon atom in the molecule or a mixture thereof with a gaseous hydrocarbon compound so as to deposit silicon carbide on to the substsrate surface in the form of a layer.

More particularly, the organosilicon compound is preferably a compound having at least two silicon atoms and at least one hydrogen atom directly bonded to the silicon atom in a molecule.

DETAILED DESCRIPTION OF THE PREFERRED EMBODIMENTS

Figure 1:
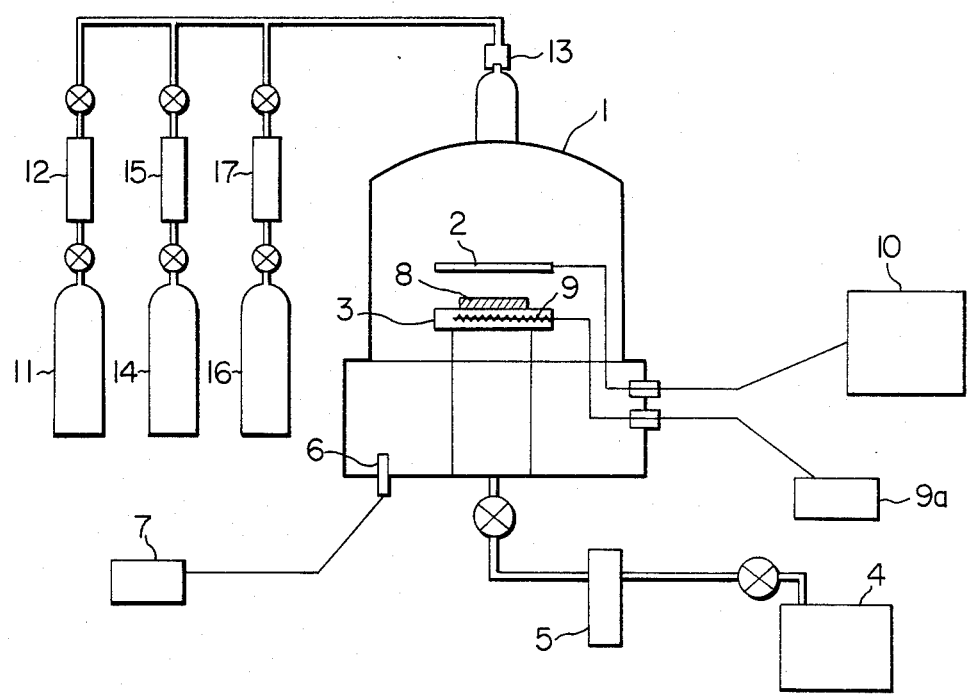
FIGS. 1 and 2 are each a schematic illustration of an apparatus used for practicing the method of the present invention.

As an advantage in the inventive method, a wide variety of substrate materials are applicable to the inventive method without particular limitation in respect of the heat resistance of the material since deposition of the silicon carbide layer on to the surface of the substrate takes place at a relatively low temperature of, for example, 50° to 500° C. Suitable materials of the substrate to which the inventive method is applied are exemplified by metallic and inorganic materials such as aluminum, tin and the like metal in the form of a foil, elementary silicon, carbon and ceramic materials such as silicon carbide, silicon nitride, alumina, quartz, glass and the like as well as heat-resistant synthetic resins such as fluorocarbon polymers, polyimide resins, polyamide resins and the like.

On the other hand, the organosilicon compound as the essential constituent of the gaseous atmosphere in which plasma is generated should have a vapor pressure sufficiently large to support the plasma discharge across the plasma chamber. The organosilicon compound should contain no halogen or oxygen atom directly bonded to the silicon atom in the molecule since an organosilicon compound containing such a halogen or oxygen atom is poorly decomposable in the condition of the plasma discharge. Typically, the organosilicon compound is exemplified by the silane or polysilane compounds represented by the general formula $R_{2n+2}Si_n$, in which R is a hydrogen atom or a monovalent hydrocarbon group selected from the class consisting of methyl, ethyl, propyl, phenyl and vinyl groups, not all of the R in a molecule being hydrogen atoms, and n is a positive integer not exceeding 4, or silhydrocarbylene compounds represented by the general formula $R_3Si-(-R^1-SiR_2-)_m-R$, in which R has the same definition as given above, $R^1$ is a hydrocarbylene group selected from the class consisting of methylene, ethylene and phenylene groups and m is 1 or 2. It is of course that an organosilicon compound having, in a molecule, simultaneously both of the polysilane linkage —Si—Si— and the silhydrocarbylene linkage —Si—$R^1$—Si— is suitable for the same purpose.

Several of the particular examples of suitable organosilicon compounds include, denoting a methyl group and a phenyl group by the symbols Me and Ph, respectively:
methylsilane MeSiH$_3$; dimethylsilane Me$_2$SiH$_2$;
trimethylsilane Me$_3$SiH; diethylsilane (C$_2$H$_5$)$_2$SiH$_2$;
propylsilane C$_3$H$_8$SiH$_3$; vinyl methylsilane (CH$_2$=CH)MeSiH$_2$;
phenylsilane PhSiH$_3$; hexamethyldisilane Me$_3$Si—SiMe$_3$;
1,1,2,2-tetramethyl disilane HSiMe$_2$—SiMe$_2$H;
1,1,2,2,3,3-hexamethyl trisilane HMe$_2$Si—SiMe$_2$—SiHMe$_2$;
1,1,2,3,3-pentamethyl trisilane HMe$_2$Si—SiHMe—SiHMe$_2$;
bis(trimethylsilyl) methane Me$_3$Si—CH$_2$—SiMe$_3$;
bis(dimethylsilyl) methane HMe$_2$Si—CH$_2$—SiHMe$_2$;
bis(dimethylsilylmethyl) dimethyl silane HMe$_2$Si—CH$_2$—SiMe$_2$—CH$_2$—SiHMe$_2$;
1,2-di(dimethylsilyl) ethane HMe$_2$Si—CH$_2$CH$_2$—SiHMe;
1,1,2,2-tetramethyl-1-dimethylsilylmethyl disilane HMe$_2$Si—CH$_2$—SiMe$_2$—SiHMe$_2$ and the like. These (poly)silane compounds may be used either singly or as a mixture of two kinds or more according to need.

It is preferable that the organosilicon compound has at least two silicon atoms and at least one hydrogen atom directly bonded to the silicon atom per molecule among the above named compounds from the standpoint of decreasing the temperature of the substrate surface during plasma-induced deposition of silicon carbide and increasing the yield and the rate of growth of the amorphous silicon carbide layer on the substrate surface.

Particularly preferable are tetramethyl disilane and hexamethyl trisilane, which compounds are readily obtained as the pyrolysis products of a methyl polysilane compound at a temperature of 350° C. or higher.

The plasma discharge in the atmosphere containing these organosilicon compounds readily converts the compounds into an amorphous silicon carbide expressed by the formula $Si_xC_{1-x}$, where x is 0.2 to 0.9, or a composite of silicon carbide with carbon or silicon, which is deposited on the substrate surface. Although the single use of one or more of the above named organosilicon compounds may be sufficient for the purpose, it is sometimes advantageous according to the value of the suffix x in the formula that the vapor of the organosilicon compound is admixed with a vapor or gas of a hydrocarbon compounds such as methane, ethane, propane, ethylene, acetylene, banzene, toluene and the like in order to ensure deposition of the silicon carbide having a desired value of the suffix x in the formula.

The method of the present invention is carried out by putting a substrate article into a plasma chamber, evacuating the plasma chamber to a sufficiently low pressure of vacuum, introducing the gas or vapor of the organosilicon compound, optionally, admixed with the gas or vapor of the hydrocarbon compound to keep a constant pressure inside the plasma chamber suitable for the generation of plasma and supplying an electric power to the electrodes of the plasma chamber to generate plasma.

It is optional that the gas or vapor of the organosilicon compound, optionally, with the hydrocarbon compound is introduced into the plasma chamber as carried according to need by a carrier gas such as helium, hydrogen, argon, nitrogen, oxygen, air, carbon dioxide, carbon monoxide and the like whereby advantageous effects are obtained that the stability of the plasma discharge is increased and the resultant surface layer of the silicon carbide may have a composition of larger stability and improved physical properties.

The plasma can readily be generated when the pressure inside the plasma chamber is kept at a pressure of 10 Torr or below or, preferably, in the range from 0.05 to 1 Torr and an electric power of 10 watts to 100 kilowatts is supplied to the electrodes installed inside the plasma chamber by the application of a high frequency voltage at a frequency of 10 kHz to 100 MHz. The electrodes may be installed outside the plasma chamber.

It is preferable that the substrate article should be kept at an elevated temperature in order to obtain uniform deposition of the silicon carbide formed by the plasma discharge in the form of a coating film on the surface. The temperature is in the range from 50° to 500° C. or, preferably, from 100° to 400° C. It is of course possible to directly heat the substrate article electrically when the material of the substrate has an adequate electric resistance but a convenient way to heat the substrate article is to put the article on one of the electrodes of the plasma chamber which is electrically grounded and heated by means of an electric heater built therein.

The coating film of the amorphous silicon carbide deposited on the substrate article and expressed by the formula $Si_xC_{1-x}$ should preferably have a composition of which the suffix x in the formula has a value in the proximity of 0.5 from the standpoint of obtaining the properties inherent to silicon carbide such as the heat resistance, oxidation resistance, resistance against chemicals and the like although the electric characteristics and photoelectric properties required in semiconductor substrates, photoconductive elements and the like can be obtained with the value of the suffix x in the range from 0.2 to 0.9. The value of the suffix x in the formula of the silicon carbide can be controlled by suitablky selecting the kind and amount of the organosilicon compound inctroduced into the plasma chamber, mixing ratio thereof with the hydrocarbon compound, kind and concentration of the carrier gas, conditions for the generation of the plasma, temperature of the substrate article and other factors.

Figure 2:
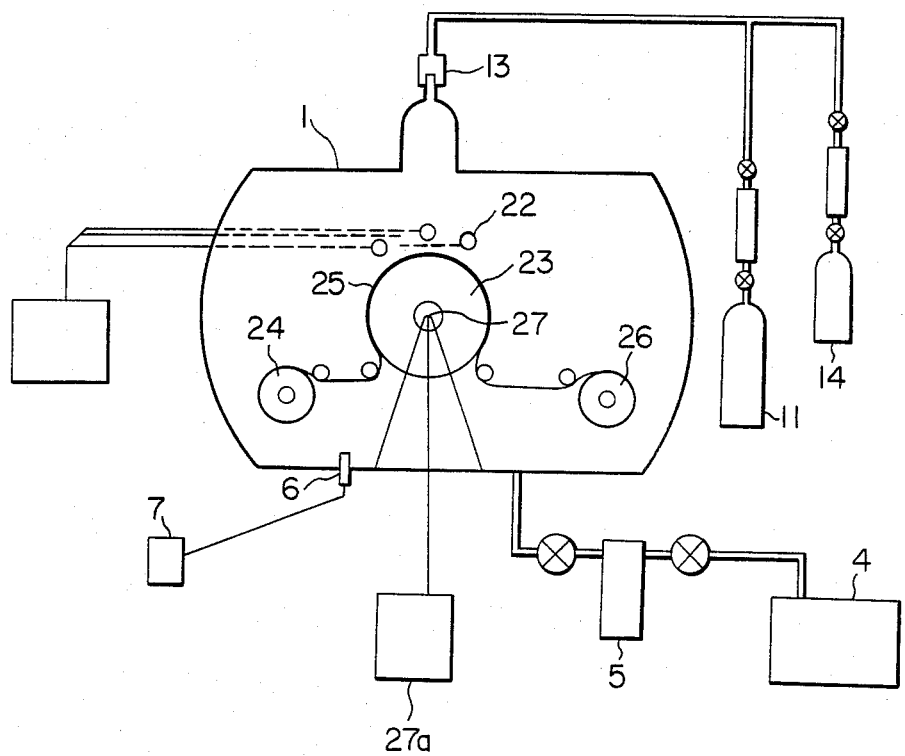

In the following, the method of the present invention is described with reference to the accompanying drawing, of which FIG. 1 is a schematic illustration of an apparatus used in a batch-wise process and FIG. 2 is a schematic illustration of an apparatus used in a continuous process for practicing the method of the present invention.

In the apparatus illustrated in FIG. 1, the plasma chamber 1 is provided with a power electrode 2 and a grounded electrode 3 installed therein and the plasma chamber 1 can be evacuated by means of a vacuum pump 4 connected thereto through a trap 5 to a pressure of 10 Torr or below. The pressure inside the plasma chamber is measured and recorded with a sensor 6 and a Pirani vacuum gauge 7. The substrate article 8 under treatment is put on the grounded electrode 3 which is heated with the electric heater 9 built therein and energized by the outer power source 9a in order to keep the substrate article 8 at a desired elevated temperature by the heat conduction from the heated electrode 3. An electric power is supplied between the power electrode 2 and the grounded electrode 3 from an outer high frequency generator 10. While the vapor or gas of the organosilicon compound contained in the vessel 11 is introduced into the plasma chamber 1 through the flow meter 12 and the nozzle 13 at such a rate that the inside pressure of the plasma chamber 1 is kept at a desired low pressure suitable for the plasma discharge, the power supply to the electrodes 2,3 generates low temperature plasma in the plasma chamber 1 so that the organosilicon compound is decomposed and converted into silicon carbide which is deposited on the surface of the substrate article 8 in the form of a coating film. When it is desired that the organosilicon compound is admixed with a hydrocarbon compound or diluted with a carrier gas mentioned before, these adjuvant gases contained in the vessels 14 or 16, respectively, are introduced into the flow line of the organosilicon compound through the respective flow meters 15 and 17.

FIG. 2 is a schematic illustration of an apparatus used for practicing the method of the invention as a continuous process, in which several power electrodes 22 each in a rod-like form surround the drum-like rotatable grounded electrode 23 in parallel to the axis of the latter. The film-like substrate material 25 to be subjected to the treatment is held in a roll on the spool 24 and pulled out thereof to be wound up on the winding-up spool 26 after passing the surface of the rotatable grounded electrode 23 in contact therewith to expose the other surface to the atmosphere of plasma generated inside the plasma chamber 1 by the supply of an electric power to the electrodes 22 and 23. The rotatable grounded electrode 23 is provided with an electric heater 27 energized by the outer power source 27a to keep the electrode 23 and the material 25 in contact therewith at a desired temperature. In short, the apparatus is operated in the same manner as in the appparatus for the batch-wise treatment illustrated in FIG. 1 except that the substrate article under treatment runs continuously from the first spool 24 to the second spool 26.

As is understood from the above description, the present invention provides a method for the formation of a film of a silicon carbide compound expressed by the formula $Si_xC_{1-x}$ as a product of the plasma-induced reaction of the organosilicon compound or a mixture thereof with a hydrocarbon compound on the surface of a variety of substrate articles. Thus, the substrate article treated according to the inventive method is provided with improved surface properties such as heat resistance and oxidation resistance as well as electric, photoelectric and semiconductive characteristics. Further, the method of the present invention is very advantageous industrially because the low treatment temperature in comparison with conventional methods eliminates the limitations on the material of the substrate article to be treated.

Following are the examples to illustrate the method of the present invention in more detail.

EXAMPLE 1

A glass plate of 2.5 cm by 10 cm wide was put on the grounded electrode of an apparatus as illustrated in FIG. 1 and heated at 300° C. by energizing the heater built in the electrode. Then, the plasma chamber was evacuated by operating a vacuum pump and, when the pressure inside the plasma chamber had reached 0.05 Torr, vapor of 1,1,2,2-tetramethyl disilane was introduced thereinto at such a rate that the pressure inside the plasma chamber was kept at 0.15 Torr by the balance of the continuous introduction of the vapor and evacuation. With the atmospheric condition inside the plasma chamber kept as described above, a high frequency electric power of 100 watts at a frequency of 13.56 MHz was supplied between the electrodes for 90 minutes to generate plasma inside the plasma chamber to which the glass plate on the electrode was exposed.

The glass plate taken out of the plasma chamber after the above treatment was found to be coated with a light yellow film of 0.4 μm thickness which was identified by the analysis to be an amorphous silicon carbide of the formula $Si_{0.5}C_{0.5}$ in a nearly pure state.

EXAMPLES 2 TO 14

A single-crystalline semiconductor silicon wafer of 2 inches diameter was put on the grounded electrode in the apparatus as shown in FIG. 1 and heated at 200° C. by energizing the heater. Then, the plasma chamber was evacuated by operating a vacuum pump and, when the pressure inside the plasma chamber had reached 0.05 Torr, hydrogen gas was introduced into the chamber at such a rate that the pressure inside was brought to 0.10 Torr and then vapor of bis(dimethylsilyl) methane was continuously introduced into the chamber so that the overall pressure inside the plasma chamber was kept at 0.20 Torr by the balance of the continuous introduction of the gases and evacuation. With the atmospheric condition inside the plasma chamber kept as described above, a high frequency electric power of 150 watts at a frequency of 13.56 MHz was supplied to the electrodes for 60 minutes to generate plasma inside the plasma chamber to which the silicon wafer was exposed.

The silicon wafer taken out of the plasma chamber after the above described treatment was found to be coated with a film of an amorphous silicon carbide expressed by the formula $Si_{0.55}C_{0.45}$ and having a thickness of 0.6 μm (Example 2).

About the same experimental procedure as above was repeated in each of Examples 3 to 14 except that the kinds of the substrate material, carrier gas and organosilicon compound were as indicated in Table 1 below with or without the addition of a hydrocarbon compound and the temperature of the substrate article was controlled as given in the table which also summarizes the thickness of the silicon carbide film formed on the substrate and the chemical composition thereof expressed by the value of the suffix x in the formula $Si_xC_{1-x}$. In Table 1, the organosilicon compounds are given by the symbols I to VI each for the compound as below.

I: Dimethylsilane
II: Methylsilane
III: 1,1,2,2-Tetramethyl disilane
IV: Hexamethyl disilane
V: 1,1,2,2,3,3-Hexamethyl trisilane
VI: 1,1,2,3,3-Pentamethyl trisilane

TABLE 1

| Example No. | Substrate Material | Substrate Temperature, °C | Reactant gas Organo-silicon compound | Reactant gas Hydrocarbon compound | Carrier gas | Silicon carbide film Thickness, μm | Silicon carbide film x value in the formula |
| --- | --- | --- | --- | --- | --- | --- | --- |
| 3 | Sapphire | 250 | I | None | Helium | 0.20 | 0.65 |
| 4 | Sapphire | 300 | I | Methane | Helium | 0.25 | 0.35 |
| 5 | Quartz | 250 | II | None | Argon | 0.30 | 0.80 |
| 6 | Alumina | 300 | II | None | Argon | 0.20 | 0.60 |
| 7 | Aluminum foil | 200 | III | None | Helium | 0.70 | 0.50 |
| 8 | Aluminum foil | 200 | III | Ethylene | Hydrogen + helium | 0.75 | 0.30 |
| 9 | Aluminum foil | 200 | IV | None | Hydrogen | 0.55 | 0.28 |
| 10 | Glass | 150 | V | None | Hydrogen + argon | 0.80 | 0.40 |
| 11 | Glass | 250 | V | Benzene | Hydrogen | 0.75 | 0.25 |
| 12 | Glass | 250 | VI | None | Nitrogen | 0.80 | 0.50 |
| 13 | Polyimide film | 150 | V | None | Hydrogen + argon | 0.70 | 0.35 |
| 14 | Polyester film | 70 | III | None | Argon | 0.70 | 0.50 |

When the silicon carbide-clad sapphire prepared in Example 4 was excited with a coherent beam of a wavelength of 488 nm from an argon ion laser, a photoluminescence of yellowish orange color having the emission peak at 2.1 eV and a half value width of 0.7 eV was obtained.

Further, the silicon carbide-clad glass plate obtained in Example 10 was provided with a coating film of ITO (indi-umtin oxide) on the surface of the silicon carbide layer and with a platinum coating film on the surface of the other side by the sputtering method as the electrodes. When an electric field was applied between the electrodes of this plate, a green luminescence having a peak at a wavelength of 550 nm, i.e. 2.35 eV, was obtained with an emission efficiency of 0.6%.

EXAMPLE 15

An aluminum foil of 0.1 mm thickness having a width of 15 cm and a length of 20 m in a roll was mounted on the spool of the apparatus illustrated in FIG. 2 and arranged to be wound up on the winding-up spool after running on the surface of the drum-like grounded electrode heated at 200° C. The plasma chamber was evacuated to a pressure of 0.03 Torr followed by the introduction of a 1:1 by volume mixture of hydrogen and argon as a carrier gas at a rate of 200 ml/minute to bring the pressure inside the plasma chamber to 0.07 Torr.

While keeping the atmospheric condition inside the plasma chamber as described above, vapor of 1,1,2,3,3-pentamethyl trisilane was introduced into the chamber at a rate of 500 ml/minute so that the pressure inside the chamber was maintained at 0.10 Torr by the balance of the continuous evacuation and introduction of the gases. Thereafter, the windingup spool of the plasma chamber was driven to roll up the aluminum foil at a velocity of 1 cm/minute while a high frequency electric power of 4 kilowatts at a frequency of 110 kHz was supplied to the electrodes to generate plasma inside the chamber to which the running aluminum foil was continuously exposed. The aluminum foil taken out of the chamber after the above treatment was found to be coated with a uniform light yellow film of 0.3 μm thickness which was identified by the analysis to be a silicon carbide expressed by the formula $Si_{0.53}C_{0.47}$.

What is claimed is:

1. A method for providing a coating layer of an amorphous silicon carbide of the composition expressed by the formula $Si_xC_{1-x}$, in which x is a positive number in the range from 0.2 to 0.9, on to the surface of a substrate which comprises subjecting the surface of the substrate to an atmosphere of plasma generated in a gaseous atmosphere containing a vapor or gas of an organosilicon compound having no halogen or oxygen atom directly bonded to the silicon atom in the molecule.

2. The method as claimed in claim 1 wherein the organosilicon compound is selected from the class consisting of organosilane or organopolysilane compounds represented by the general formula $R_{2n+2}Si_n$, in which R is a hydrogen atom or a monovalent hydrocarbon group and n is a positive integer of 1 to 4, and organosilhydrocarbylene compounds represented by the general formula $R_3Si-(-R^1-SiR_2-)_m-R$, in which R has the same meaning as defined above, $R^1$ is a hydrocarbylene group selected from the class consisting of methylene, ethylene and phenylene groups, and m is 1 or 2.

3. The method as claimed in claim 1 wherein the vapor or gas of the organosilicon compound is admixed with a vapor or gas of a hydrocarbon compound.

4. The method as claimed in claim 3 wherein the hydrocarbon compound is selected from the class consisting of methane, ethane, propane, ethylene, acetylene, benzene and toluene.

5. The method as claimed in claim 1 wherein the pressure of the gaseous atmosphere is in the range from 0.05 to 1 Torr.

6. The method as claimed in claim 1 wherein the organosilicon compound has at least one hydrogen atom directly bonded to the silicon atom in a molecule.

7. The method as claimed in claim 1 wherein the organosilicon compound has at least two silicon atoms in a molecule.

8. The method as claimed in claim 1 wherein the substrate is kept at a temperature in the range from 50° to 500° C.

9. The method as claimed in claim 7 wherein the organosilicon compound is selected from the class consisting of 1,1,2,2-tetramethyl disilane, hexamethyl disilane, 1,1,2,2,3,3-hexamethyl trisilane and 1,1,2,3,3-pentamethyl trisilane.

* * * * *